United States Patent
Kannurpatti

(10) Patent No.: US 8,883,393 B2
(45) Date of Patent: *Nov. 11, 2014

(54) PRINTING FORM PRECURSOR FOR USE AS A RECORDING ELEMENT

(75) Inventor: Anandkumar R. Kannurpatti, Glen Mills, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 320 days.

This patent is subject to a terminal disclaimer.

(21) Appl. No.: 12/634,292

(22) Filed: Dec. 9, 2009

(65) Prior Publication Data

US 2010/0086751 A1    Apr. 8, 2010

Related U.S. Application Data

(62) Division of application No. 11/321,922, filed on Dec. 29, 2005, now abandoned.

(60) Provisional application No. 60/642,346, filed on Jan. 7, 2005.

(51) Int. Cl.
*G03F 7/00* (2006.01)
*G03C 1/00* (2006.01)
*G03C 5/00* (2006.01)
*G03F 7/105* (2006.01)

(52) U.S. Cl.
CPC ....................... *G03F 7/105* (2013.01)
USPC ..................... 430/270.1; 430/281.1; 430/296; 430/394

(58) Field of Classification Search
USPC ......... 430/302, 303, 304, 305, 306, 307, 308, 430/309; 428/690
See application file for complete search history.

(56) References Cited

U.S. PATENT DOCUMENTS

| | | | |
|---|---|---|---|
| 3,801,324 A | 4/1974 | Postal | |
| 3,854,950 A | 12/1974 | Held | |
| 4,482,424 A | 11/1984 | Katzir et al. | |
| 4,857,228 A | 8/1989 | Kabay et al. | |
| 4,865,944 A | 9/1989 | Roberts et al. | |
| 5,143,818 A | 9/1992 | Weed et al. | |
| 5,461,136 A | 10/1995 | Krutak et al. | |
| 5,910,390 A | 6/1999 | Hatanaka et al. | |
| 6,106,910 A | 8/2000 | Tan et al. | |
| 6,238,837 B1 | 5/2001 | Fan | |
| 6,329,111 B1 * | 12/2001 | Nojiri et al. | 430/25 |
| 6,355,395 B1 * | 3/2002 | Zwez et al. | 430/271.1 |
| 6,437,816 B1 | 8/2002 | Fujita et al. | |
| 6,440,649 B1 | 8/2002 | Simpson et al. | |
| 6,590,657 B1 | 7/2003 | Summerer et al. | |
| 6,638,696 B1 | 10/2003 | Donovan | |
| 7,029,808 B2 | 4/2006 | Rau et al. | |
| 7,122,248 B2 | 10/2006 | Tam et al. | |
| 2002/0042019 A1 | 4/2002 | Grober et al. | |
| 2002/0130304 A1 * | 9/2002 | Paeschke et al. | 252/500 |
| 2003/0036006 A1 | 2/2003 | Feke et al. | |
| 2003/0139484 A1 * | 7/2003 | Bentsen et al. | 522/2 |
| 2005/0064348 A1 * | 3/2005 | Ohta | 430/348 |
| 2005/0142480 A1 | 6/2005 | Bode et al. | |
| 2005/0196701 A1 * | 9/2005 | Rapp et al. | 430/302 |
| 2006/0124008 A1 | 6/2006 | Kessenich et al. | |

FOREIGN PATENT DOCUMENTS

| | | |
|---|---|---|
| EP | 1241242 | 9/2002 |
| EP | 1251400 | 10/2002 |
| GB | 2258659 | 2/1993 |
| GB | 2 264 558 A | 9/1993 |
| GB | 2259410 | 10/1993 |
| JP | 53045180 | 4/1978 |
| JP | 59-208724 A | 11/1984 |
| JP | 06-152100 A | 5/1994 |
| JP | 11-202480 A | 7/1999 |
| JP | 2001-255808 | 9/2001 |
| JP | 2001-260551 A | 9/2001 |
| JP | 2004-532358 A | 10/2004 |
| JP | 2005-321494 A | 11/2005 |
| WO | WO 02/19255 A1 | 3/2002 |
| WO | WO 02/098670 A2 | 12/2002 |

* cited by examiner

*Primary Examiner* — Chanceity Robinson

(57) ABSTRACT

The invention relates to an imaging element and a method of using the imaging element to form a recording element. The imaging element includes a composition sensitive to actinic radiation at a first wavelength and a photoluminescent tag that is responsive to radiation at a second wavelength different from the first wavelength. The photoluminescent tag can be used to authenticate the identity of the element, provide information about the element, and/or to establish one or more conditions in a device used to prepare the recording element from the imaging element.

27 Claims, No Drawings

PRINTING FORM PRECURSOR FOR USE AS A RECORDING ELEMENT

BACKGROUND OF THE INVENTION

1. Field of the Invention

This invention pertains to an imaging element for use as a recording element and a process for preparing the recording element from the imaging element. In particular, this invention relates to a photosensitive imaging element having a photoluminescent tag disposed therein. More particularly, this invention relates to a photosensitive imaging element for use as a printing form, and a process for preparing the form from the element.

2. Description of Related Art

Polymer products are used as components of imaging and photosensitive systems and particularly in photoimaging systems such as those described in "Light-Sensitive Systems: Chemistry and Application of Nonsilver Halide Photographic Processes" by J. Kosar, John Wiley & Sons, Inc., 1965 and more recently in "Imaging Processes And Material—Neblette's Eight Edition" edited by J. Sturge, V. Walworth and A. Shepp, Van Nostrand Reinhold, 1989. In such systems, actinic radiation impinges on a material containing a photoactive component to induce a physical or chemical change in that material. An image or latent image is formed which can be thereby be processed into a useful image forming a recording element. Typically actinic radiation useful for imaging is light ranging from the near ultraviolet through the visible spectral regions, but in some instances may also include infrared, deep-ultraviolet, X-ray, and electron beam radiation.

Although the polymer product itself may be photoactive, generally a photosensitive composition contains one or more photoactive components in addition to the polymer product. Upon exposure to actinic radiation, the photoactive component acts to change the rheological state, the solubility, the surface characteristics, refractive index, the color, the electromagnetic characteristics or other such physical or chemical characteristics of the photosensitive composition as described in the Neblette's publication supra.

Polymer products are particularly useful in photopolymerizable systems such as disclosed in Chapter 7 of the Neblette's publication supra. Such photopolymerizable systems typically have at least one addition polymerizable monomeric component having one or more sites of terminal ethylenic unsaturation, and one or more polymers as a binding agent. Frequently the binding agent is a polymer, or simple polymer blend, i.e., an intimate mixture of two or more polymers. During imaging exposure, the monomeric component polymerizes and/or crosslinks to form a polymer or polymer network in which at least some of the polymeric binding agent is entrapped thereby rendering a change in the physical or chemical characteristics, that is, typically photohardening or insolubilizing, the exposed area or areas.

Some examples of imaging systems include photopolymer and resist systems for use as printing plates, pre-press proofs, and resists in circuit board and chips; and press printing systems, such as lithography, gravure, letterpress, flexography, and screens, for use in press printing and circuit board printing. For each end-use application of the polymer products a plethora of imaging elements exist due to the number of manufacturers as well as the variety of products provided by each of the manufacturers to address particular needs in end-use situations. Any one end-user facility may have a number of imaging products available to meet their and their customer's needs, but it may be difficult to monitor consumption and appropriate process conditions to convert the imaging product into desired recording material. From an end user's standpoint, it is desirable to be able to identify the imaging element should it become separated from its packaging. From the manufacturer's standpoint, when assisting the end-users and/or accepting a returned imaging product it is desirable to verify that the imaging product is in fact one made by the manufacturer, not from another manufacturer, and not a counterfeit product. Thus it is desirable for users to be able to authenticate the identity of the imaging element.

Furthermore, each imaging element typically undergoes a process of multiple steps on one or more different devices that are used to convert the imaging elements into useful recording product. Devices used include, for example, actinic radiation exposure units, laser-radiation exposure units and imagers, processors for removing selected composition material with heat or with a solution, processors for developing latent image with heat or with a solution, and lamination units for forming assemblages with the imaging element or other supports. The setup for each device can be complex and dependent upon the particular variety of imaging element being worked on. Each step in the process of forming recording elements for imaging element involves multiple parameters that need to be set appropriately to extract the optimum performance of the imaging element and create the desired recording element that satisfies the end user's needs. Thus, it is desirable to not only identify the imaging element, but also to use this identification information to direct the establishment of the parameters in the variety of devices used in the imaging process automatically without the need for human intervention.

SUMMARY OF THE INVENTION

In accordance with this invention there is provided an imaging element comprising a composition sensitive to actinic radiation at a first wavelength, wherein a photoluminescent tag is disposed in the element, the tag being responsive to radiation at a second wavelength different from the first wavelength.

In accordance with another aspect of this invention there is provided a method for making a recording element from the imaging element. The method comprises exposing the imaging element to the actinic radiation and treating the element to form the recording element.

In accordance with another aspect of this invention there is provided a method for setting conditions in a device used for making a recording element. The method includes a) providing the imaging element comprising a layer of a composition sensitive to actinic radiation at a first wavelength, wherein a photoluminescent tag is disposed in the element, the tag being responsive to radiation at a second wavelength different from the first wavelength, b) exposing the element to radiation at the second wavelength to excite or stimulate the tag and create an emission from the tag; c) detecting the emission; and d) setting one or more conditions for operation of the device according to the detected emission from step c).

DESCRIPTION OF THE PREFERRED EMBODIMENTS

The present invention concerns an imaging element and a process of using the imaging element to form a recording element. The imaging element comprises a composition sensitive to actinic radiation, that is, the imaging element includes a layer of the composition that is photosensitive. The imaging element is sensitive to actinic radiation at a first wavelength, and includes a photoluminescent tag that is responsive to radiation at a second wavelength different from the first wavelength. The imaging element includes the photoluminescent tag that can be used to authenticate the identity of the element, to provide information about the element, and/or to establish one or more conditions in a device used to prepare a recording element from the imaging element. The photoluminescent tag may also be referred to herein as tag, tag material, tag compound, photoluminescent material, or photoluminescent compound.

Various embodiments of the imaging element of the present invention are intended for use as recording elements, including, but are not limited to, printing forms, pre-press proofs, resists, and color filters. Resists are used in the formation of circuit patterns in circuit boards and chips. Printing forms include recording elements used for flexographic, letterpress, gravure, and lithographic printing. The imaging element for printing end-use can be of any shape or form including plates and cylinders.

It is surprising that the sensitometric properties of the imaging element do not change or deteriorate as a result of the presence of the photoluminescent tag material in the element. The presence of an additive, such as the photoluminescent tag, as a particulate or other absorbing material in the element tends to reduce the penetration of the actinic radiation required to alter the physical or chemical characteristics of the composition layer. If the composition layer is insufficiently altered by exposure to actinic radiation, the imaging element will not successfully achieve the required end-use properties for the recording element. Particularly when the tag compound is an inorganic particulate form, it is quite surprising that their presence does not cause scatter of the actinic radiation used to image the photosensitive composition.

Unless otherwise indicated, the following terms as used herein have the meaning as defined below.

"Actinic radiation" refers to radiation capable of initiating reaction or reactions to change the physical or chemical characteristics of a photosensitive composition.

"Excitation" refers to a process in which an atom or molecule gains energy from electromagnetic radiation or from collision raising it to an excited state.

"Excitation energy" refers to the energy required to change a system from its ground state to a particular excited state.

"Fluorescence" and "Fluorescent" refers to a phenomenon in which a material releases or emits energy immediately following excitation, or emission following with a delay shorter than $10^{-8}$ seconds.

"Luminescence" and "Luminescent" refers to a phenomenon in which a substance is excited by an external energy source and emits this energy in the form of light and/or radiation.

"Phosphor" refers to a substance either, organic or inorganic, liquid or crystalline, that is capable of luminescence.

"Phosphorescence" and "Phosphorescent" refers to materials that have stored energy by excitation, and that release the stored energy gradually over an period of time without the need for external stimulation.

"Photoluminescent" and "Photoluminescence" refers to luminescence stimulated or excited by visible, infrared, or ultraviolet radiation.

"Stimulated emission" refers to the phenomena in which a substance that has stored energy by excitation, and releases the stored energy only after being excited with an external stimulating energy source.

"Visible radiation or light" refers to wavelengths of radiation between about 390 and 770 nm.

"Infrared radiation or light" refers to wavelengths of radiation between about 770 and $10^6$ nm.

"Ultraviolet radiation or light" refers to wavelengths of radiation between about 10 and 390 nm.

Note that the provided ranges of wavelengths for infrared, visible, and ultraviolet are general guides and that there may be some overlap of radiation wavelengths between what is generally considered ultraviolet radiation and visible radiation, and between what is generally considered visible radiation and infrared radiation.

The presence of the photoluminescent tag in the imaging element can be used to identify the element, which can then correspondingly be used to direct one or more conditions in a device or devices used to prepare a recording element from the imaging element. At any step of a process of forming the recording element from the imaging element, the imaging element is exposed to the second wavelength of radiation, exciting the photoluminescent tag to emit energy in the form of light or radiation at a given wavelength. The photoluminescent tag is responsive to radiation at a wavelength different from at least one, and possibly more, of the wavelengths of actinic radiation used to convert the imaging element into a recording element. The photoluminescent tag can be stimulated by visible, infrared, or ultraviolet radiation. The response of the photoluminescent tag to the stimulation, excites the tag to an energized state, and emits energy as radiation, preferably as light. The tag may emit energy immediately or substantially immediately (i.e., delay shorter than $10^{-8}$ seconds) whereby the tag exhibits fluorescence. Alternatively the excited tag may store the energy and release the stored energy gradually over a period of time without the need for external stimulation, whereby the tag exhibits phosphorescence. In fluorescence and phosphorescence phenomena, typically the emitted radiation is of a longer wavelength of radiation than that used to excite the tag. In another alternative, the excited tag may store the energy and release the stored energy only after being stimulated externally with a different wavelength, whereby the tag exhibits stimulated emission. The tag that exhibits stimulated emission may be excited to store the energy by the second wavelength or when the tag compound is produced. Excitation of the photoluminescent tag is stimulation to elicit a response that encompasses fluorescence, phosphorescence, and/or stimulated emission. It is also possible that the photoluminescent tag exhibits more than one type of emission, that is, exhibits fluorescence and phosphorescence; or phosphorescence and stimulated emission; or fluorescence and stimulated emission; or fluorescence, phosphorescence, and stimulated emission. Typically the emitted radiation is at a third wavelength different from the wavelength of radiation used for stimulating the tag (i.e., the second wavelength).

The photoluminescent tag is disposed in the imaging element. As will be described below, the imaging element has a composition sensitive to actinic radiation, i.e., a photosensitive composition, forming a layer of the element. The imaging element can also include one or more additional layers. The photoluminescent tag may be disposed in any one or more of the layers, i.e., photosensitive and/or additional layers, associated with the imaging element, by incorporation into a composition forming any one or more layers of the element. It is also contemplated that the imaging element can contain more than one photoluminescent tag compounds. In one embodiment the photoluminescent tag is included in the composition that is sensitive to actinic radiation. In an alternate embodiment, the photoluminescent tag material is included in one or more additional layers that are not sensitive to the actinic radiation. The additional layer may be directly adjacent or non-adjacent the composition layer sensitive to actinic radiation. The additional layer may be integral with the imaging element or may be associated in a separate element that can form an assemblage with the imaging element. The additional layer may have one or more functions for the imaging element in addition to the function/s associated with the presence of the photoluminescent tag in the element. Alternatively, the imaging element may include the photoluminescent tag in its own layer independent of one or more of the additional functional layers. In embodiments where the photoluminescent tag material is included in the additional layer, the additional layer may be present, and preferably is present during the exposure of the imaging element to actinic radiation. In the case where the tag is incorporated into its own layer, the tag layer need not fully cover the other functional layer/s of the element, and can form a "detecting strip" for the imaging element, for example, along a side or middle of the element. The detecting strip may overlap with the image region of the imaging element or recording element.

The photoluminescent tag may be present in the imaging element for all or only a portion of the process steps necessary to convert the imaging element into a recording element. For example, the tag may be included in the photosensitive layer of an imaging element for use as a printing form. The tag would be present in the imaging element for the steps of exposing to actinic radiation and treating to create the structure for printing, and thereby be present in the final printing form. Alternately the tag may be included in a temporary layer for the imaging element wherein the tag is only present in the imaging element for one (or more) of the steps forming the recording element, and thereby not be present in the recording element. For example, the tag may be incorporated into a temporary layer in the imaging element for use as a printing form, such that the tag is present during exposure to actinic radiation step, but is removed during a treating step that creates the printing form.

The photoluminescent tag is chosen so that exposure of the imaging element at the second wavelength does not induce unwanted response, that is, a change in one or more physical or chemical properties, in the imaging element. In one embodiment the photoluminescent tag is chosen so that exposure at the second wavelength does not influence the photosensitive response of the imaging element.

The imaging element is sensitive to actinic radiation at the first wavelength, $\lambda_1$. The photoluminescent tag is responsive to radiation at a second wavelength, $\lambda_2$, different from the first wavelength. In one embodiment the imaging element is sensitive to actinic radiation at the ultraviolet and/or the visible wavelengths, and the tag is responsive to infrared radiation. In an alternate embodiment, the imaging element is sensitive to actinic radiation in a first region of infrared wavelengths, and the tag is responsive to radiation in a second region of infrared wavelengths different from the first region. In yet another embodiment, the imaging element is sensitive to actinic radiation in the infrared wavelengths, and the tag is responsive to radiation in the ultraviolet and/or visible wavelengths.

The photoluminescent tag can be included in the composition sensitive to actinic radiation or in any other additional layer, or in its own layer for the imaging element. The photoluminescent tag can be incorporated with a component that allows for dispersing of the tag in the composition and uniform distribution of the tag in a layer suitable for use with the imaging element. The layer containing the tag can be prepared by conventional methods by combining the tag with the one or more components. Generally it is not suitable to combine the tag that is in particulate form in a liquid-like component due to the difficulty in dispersing the tag in solution. In one embodiment when the tag is a particulate, a dispersant is added in order to disperse the tag particles and avoid flocculation and agglomeration. A wide range of dispersants are commercially available. Suitable dispersants are the A-B dispersants generally described in "Use of A-B Block Polymers as Dispersants For Non-aqueous Coating Systems" by H. K. Jakubauskas, *Journal of Coating Technology*, Vol. 58; Number 736; pages 71-82. Useful A-B dispersants are disclosed in U.S. Pat. Nos. 3,684,771; 3,788,996; 4,070,388; and 4,032,698. The dispersant is generally present in an amount of about 0.1 to 10% by weight, based on the total weight of the layer. In another embodiment when the tag is a particulate, the tag is incorporated with a binder. When the tag is incorporated into its own layer, the tag can be combined with a polymeric binder which can be selected from the binders described as suitable for use in the photosensitive layer and the additional layers, and which can be the same or different from the binder used in the photosensitive layer and/or the additional layers. A preferred method for preparing the composition containing the tag is to precompound the tag with a portion of the total amount of binder, and then add the remaining portion of the binder to the precompounded mixture. Adding of the precompounding mixture to the remaining portion of the binder encompasses diluting, mixing, and/or blending. At any point in the precompounding, a solvent can be used for dispersing the materials used in the diluting, mixing, and/or blending steps. The weight ratio of the precompounded mixture to the remaining binder portion is preferably 1:10000 to 1:100. This is done to ensure that the particulate tag material is well dispersed in the binder and uniformly distributed in the layer. In this way, the photoluminescent tag compound will respond to the exposure of the second wavelength similarly when detected in an imaged area or in a non-imaged area of the imaging element. The weight ratio ensures the level at which the tag is included in the photosensitive element. The lower the concentration of the tag the more difficult it is to detect its presence; however, the lower the concentration of the tag the less impact the tag may have on the imaging process.

The tag is present in the imaging element in an amount sufficient to elicit a response when exposed to the second wavelength. When the photoluminescent tag is present in the composition sensitive to actinic radiation, the tag can be in concentrations from 1 to 1000 parts per million (ppm) (1 ppm to 0.1 weight %) based on the total components in the layer, preferably less than 750 ppm, more preferably less than 500 ppm, and most preferably less than 200 ppm. When the photoluminescent tag is present in one or more of the additional layers, it may be possible and sometimes necessary for the tag to be present in concentrations less than 100 ppm, preferably less than 50 ppm, based on total components in the layer. When the tag is disposed in or on the support of the photosensitive element, it may be sufficient for the tag to be present in 1 to 20 ppm. In any case, the tag may be present in the photosensitive composition, or in one or more of the additional layers, or in the support in greater than the suggested amounts. The amount of tag needed to provide desired functionality in the imaging element, can depend on the thickness of the layer that the tag is incorporated, the concentration of actinic radiation absorbers, e.g., photoinitiators, the solubility or dispersibility of the tag in the layer, and the efficacy of the tag.

As an inorganic, the photoluminescent tag typically is in particulate form. A suitable size of particles is less than the smallest wavelength of light used to create the recording element. This is would mitigate any light scattering during the exposure/s due to the presence of the particles. For example, in the case of an UV-imaged printing plate, as the dominant wavelength used to create the three-dimensional image is 365 nm, the suitable size for the particles is expected to be less than 0.365 microns. However, surprisingly, it was found that as long as the concentration of the particles is below 1000 ppm, the size of tag particles can be as high as 10 microns. Thus a suitable range of tag particle size is about 0.2 microns to 10 microns. Smaller particle sizes, that is, particles less than 0.2 microns to as small as nanoparticles (100 nm or less) could also be used, provided that agglomeration of the particulate can be avoided. Nanometer size phosphor particles can be produced by aerosol decomposition, spray pyrolysis, combustion, hydrothermal, or sol gel type processes. It should be noted that to a certain extent, the size of the particles may be impacted by the feature size that needs to recorded on the element. The smaller the feature size of the recording image the smaller the size scale of the particles. Examples of this trade-off can be encountered in photoresists.

The photoluminescent tag is not limited and can include inorganic photoluminescent materials and organic photoluminescent materials. Photoluminescent tag encompasses materials that exhibit fluorescence, phosphorescence, and/or stimulated emission. Organic photoluminescent materials can be incorporated into the composition, e.g., photosensitive composition, provided that the tag is compatible with the constituents in the composition. By compatibility is meant the ability of two or more constituents to remain dispersed with one another without causing appreciable scattering of actinic radiation. Compatibility is often limited by the relative proportions of the constituents and incompatibility is evidenced by formation of haze in the composition. Some light haze of layers formed from such compositions before or during exposure can be tolerated, but preferably haze is avoided. The amount of tag used is therefore limited to those compatible concentrations below that which produces undesired light scatter or haze.

Suitable photoluminescent tag materials can include, but are not limited to, small molecule organic fluorescent compounds, fluorescent and phosphorescent metal complexes, conjugated polymers, and mixtures thereof. Examples of fluorescent compounds include, but are not limited to, pyrene, perylene, coumarin, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In the case of organic photoluminescent materials, the tag does not encompass compounds that are considered optical brighteners. Optical brighteners, also known as optical bleach, colorless dye, fluorescent brightener, is a colorless fluorescent organic compound which absorbs ultraviolet light and emits it as visible blue light.

Preferred for the photoluminescent tag are inorganic photoluminescent materials. Suitable inorganic photoluminescent tag materials are disclosed by Kabay et al. in U.S. Pat. No. 4,857,228 which is hereby incorporated by reference in its entirety. The photoluminescent tags are a crystalline matrix including sulfur (sulphur), selenium, and an alkaline earth metal selected from the group consisting of calcium, strontium, and combinations thereof. The tag also includes one or more activators dispersed in the matrix. The activators and the matrix cooperatively define active sites for emission of electromagnetic radiation. The activators are preferably heavy metals or transition metals, such as europium (Eu), samarium (Sm), and bismuth (Bi). Combinations of activators can also be used.

Other suitable inorganic photoluminescent tag materials are disclosed by Sugita et al. in GB 2063904 A which is hereby incorporated by reference in its entirety. The inorganic photoluminescent tags are phosphors of carbonates, sulphates, silicates, sulfides, oxides, or halides of one the following calcium, beryllium, magnesium, strontium, barium, lithium, sodium, zinc, aluminum, lead. The phosphor is combined with an activator selected from the group consisting of strontium, magnesium, tin, bismuth, boron, manganese, lead, chromium, copper, lanthanum, neodymium, europium, samarium, thulium, yttrium, terbium.

Still further suitable examples of photoluminescent tag compounds are disclosed by Soled et al. in EP 0339 895 A1 which is hereby incorporated by reference in its entirety. The photoluminescent tag compounds comprise an alkaline earth chalcogenide host and europium and thulium activators. The host is represented by the formula comprising M:X wherein M is selected from the group consisting of magnesium, calcium, strontium, barium, and mixtures thereof, and X is selected from the group consisting of sulfur, selenium, and mixtures thereof. The europium and thulium activator can be oxides, sulfates, carbonates, nitrates, halides or mixtures thereof.

Preferred photoluminescent tag compounds are Anti-Stokes phosphors. Anti-Stokes phosphors refers to compounds in which the energy emitted is greater than the energy absorbed, that is, the wavelength of radiation emitted from the phosphor is shorter than the wavelength of the radiation that is used to stimulate or excite the phosphor. These phosphors are capable of converting comparatively low-energy infrared excitation radiation into high-energy radiation wherein the radiation emitted can be in the visible as well as in the invisible range. Such phosphors include thulium-activated and ytterbium co-doped oxysulfides as disclosed by Paeschke et al. in U.S. Publication 2002/0130304 which is hereby incorporated by reference in its entirety. The oxysulfide may be based upon a matrix using gadolinium, yttrium, lanthnum, and lutetium. Also suitable are the oxysulfide anti-Stokes phosphors disclosed by Bratchley et al. in GB 2,258,659 and GB 2,258,660 which are hereby incorporated by reference. The oxysulfide phosphor uses $Y_2O_2S$ as the basic lattice material. Also suitable are the oxysulfide anti-Stokes phosphors disclosed by Muller et al. in WO00/60527 which is hereby incorporated by reference, wherein the phosphors are $Y_2O_2S$:Yb, Er, $Y_2O_2S$:Yb, Tm and $Gd_2O_2S$:Yb, Er. Particularly preferred photoluminescent tag compounds are metal oxysulfides that are infrared excited phosphors.

Imaging Element

The imaging element comprises at least one composition layer sensitive to actinic radiation, that is, the layer is photosensitive. The term "photosensitive" encompass any system in which the at least one photosensitive layer is capable of initiating a reaction or reactions, particularly photochemical reactions, upon response to actinic radiation at the first wavelength. The sensitive compositions of this invention include those imaging elements in which a change in a monomer or a polymer is activated by actinic radiation, which may also be referred to as polymer imaging systems. Conventional polymer imaging systems typically employ one of three distinct imaging reactions which are photocrosslinking, photosolubilization, or photoinitiated polymerization. Photocrosslinking of a preformed polymer occurs either through dimerization of pendent reactive groups attached directly to the polymer chain or reaction of the polymer with a separate polyfunctional photoactivated crosslinking agent. The resulting increase in molecular weight or network formation can produce large changes in the solubility or in other physical properties of the polymer. Photosolubilization of a preformed polymer is brought about by the photoinitiated reaction of either pendent reactive groups or other molecules in the composition to increase the solubility of the polymer. Normally little change in the molecular weight of the polymer occurs. In photoinitiated polymerization relatively low molecular weight monomers undergo photoinitiated cationic or free radical polymerization to form polymers. In this system relatively low molecular weight monomers are combined to form higher molecular weight polymers. Polymerization is generally initiated by photoactivation of an additional low molecular weight compound known as the photoinitiator. Polyfunctional monomers are frequently used so that highly crosslinked networks are formed.

Sensitive Compositions

The imaging element can include as the composition sensitive to actinic radiation, a sensitive composition containing at least one photoactive or thermally active component. These include particular sensitive compositions such as photoresists, solder masks, printing precursors, and the like, which will be further described to illustrate this invention. "Photoactive", which is synonymous with "photosensitive", describes a material which changes its chemical or physical nature, or causes such a change, upon exposure to actinic radiation, in such a way that the change is formed directly, e.g., an image, or that a precursor, e.g., a latent image, is formed which upon further treatment produces the desired change. "Thermally active" describes a material which changes its chemical or physical nature, or causes such a change, when its temperature is raised or when a substance is added or removed. Illustrative of such a photoactive or thermally active component is a material which cyclizes, dimerizes, polymerizes, crosslinks, generates a free radical, generates an ionic species or dissociates upon exposure to actinic radiation or when it is heated. Photoactive or photosensitive component includes a photoinitiator, a photosensitizer or a combination thereof; a photosolubilizer; a photodesensitizer; a photoinhibitor; a phototackifier; a photodetackifier; or a component which is photodegradable; photochromic; photoreducible; photo-oxidizable; photoadhesive; photoreleaseable; photomagnetic; photodemagnetic; photoconductive or photoinsulative; or is a material which changes or causes changes in refractive index upon exposure to actinic radiation. The sensitive compositions of this invention typically include those instances in which the imaging element undergoes photocrosslinking or photosolubilization reactions.

Examples of these photosensitive systems and particularly photoimaging systems are described in "Light-Sensitive Systems: Chemistry and Application of Nonsilver Halide Photographic Processes" by J. Kosar, John Wiley & Sons, Inc., 1965 and more recently in "Imaging Processes And Materials—Neblette's Eighth Edition" Edited by J. Sturge, V. Walworth and A. Shepp, Van Nostrand Reinhold, 1989. In such systems, actinic radiation impinges on a material containing a photoactive component to induce a physical or chemical change in that material. A useful image or latent image that can be processed into a useful image can thereby produced, that is, a recording element. Typically actinic radiation useful for imaging is radiation ranging from the near ultraviolet through the visible spectral regions, but in some instances may also include infrared, deep-ultraviolet, X-ray and electron beam radiation. Upon exposure to actinic radiation, the photoactive component acts to change the rheological state, the solubility, the surface characteristics, refractive index, the color, the electromagnetic characteristics or other such physical or chemical characteristics of the photosensitive composition as described in the Neblette's publication supra.

Typically the photosensitive compositions of this invention are used in the form of a supported film or layer although unsupported solid objects may also be prepared. The photosensitive composition is applied to a suitable substrate to form a continuous film or layer thereon which is imagewise exposed to actinic radiation to form an image directly or latent image. Alternatively, the layer may be uniformly exposed to actinic radiation to cure or harden the layer when the photosensitive composition is applied either in the form of a continuous or patterned layer such as a protective finish, a paint or ink. Any conventional source of actinic radiation may be used including arc, discharge, and incandescent lamps as well as lasers, X-ray and electron beam units. The layer may be applied as a neat, solvent-free, photosensitive liquid or as a solution and dried to a solid layer wherein any conventional coating or printing process may be used. Alternatively, the layer or film may be applied by laminating a supported solid photosensitive layer to the substrate and then optionally removing the support.

Applications requiring no additional processing steps after exposure to actinic radiation, include those where an image is formed directly, e.g., photopolymer holograms as disclosed by Haugh in U.S. Pat. No. 3,658,526 wherein the refractive index changes upon exposure to actinic radiation, diffusion resists by Gervay and Walker in U.S. Pat. No. 3,718,473, color forming systems as by Cescon and Dessauer in U.S. Pat. No. 3,445,234 or other photochromic systems. Color forming systems based on photooxidatizable or photoreducible agents are disclosed by MacLachlan in U.S. Pat. No. 3,390,996. Also included are those applications where decorative or protective coatings are applied and photocured or where a patterned layer is applied and photocured, e.g. a photoresist screen printing ink as by Lipson et al. in U.S. Pat. No. 4,003,877.

In those instances when a latent image is formed, the exposed or unexposed areas of the layer containing the latent image are then modified by removing exposed or unexposed areas, depositing a material on or in the exposed or unexposed areas or further treating the layer to develop an imaged layer. Exposed or unexposed areas of the layer may be removed to form either a deep relief image or a thin stencil image with solvent or aqueous alkaline or aqueous-based developers therefor or they may be peeled from the complimentary unexposed or exposed areas adhered to the substrate. A deep relief image in which the sides of the relief are tapered and do not extend to the substrate, typically is used as a letterpress or flexographic printing plate, e.g., as disclosed by Plambeck in U.S. Pat. No. 2,760,863 and Brennen and Chen in U.S. Pat. No. 4,323,637. A stencil image, in contrast, is a thin relief having vertical side walls down to the substrate thereby forming complimentary uncovered substrate surface areas. A stencil image has numerous applications, e.g., as a resist as disclosed by Celeste in U.S. Pat. No. 3,469,982, as a lithographic printing plate as by Alles in U.S. Pat. No. 3,458,311, a photopolymer litho film as by Bratt and Cohen in U.S. Pat. No. 4,229,517, a peel-apart drafting film as by Colgrove in U.S. Pat. No. 3,353,955, or in peel-apart proofing systems as by Cohen and Fan in U.S. Pat. No. 4,247,619. When a stencil image is formed and is used as a resist, unprotected substrate areas are formed which may be further modified by etching the unprotected surface areas or depositing a material thereon. The exposed or unexposed areas of the layer containing the latent image may be modified by depositing a material thereon such as a photodetackification process wherein powdered material is adhered to the unexposed areas, e.g., as in the proofing process of Chu and Cohen in U.S. Pat. No. 3,649,268, or a phototackification or photoadhesive process where powdered material is adhered to the exposed areas of the layer, e.g., as in the proofing processes of Chu et al. in U.S. Pat. No. 4,243,741 and Grossa in U.S. Pat. No. 4,604,340. Liquid toners are also used in electrostatic systems to develop latent images in a photoconductive or a photoinsulative process such as disclosed by Riesenfeld et al. in U.S. Pat. No. 4,732,831. Photomagnetic and photodemagnetic systems are used to apply dye to fabrics and resists to circuit boards as disclosed by Gorondy in U.S. Pat. No. 4,105,572, Nacci in U.S. Pat. No. 4,292,120 and Nacci et al. in U.S. Pat. Nos. 4,338,391 and 4,359,516.

Photosensitive compositions containing a latent image may also be developed into an image by treatment with a reagent or by further treatment with actinic radiation or heat. Conventional silver halide or diazotype systems form a latent image upon exposure which is developed into a visible image upon treatment with a developing reagent. In some silver halide direct-writing systems, development to a visible image is accomplished by uniform exposure to actinic radiation. In some reversal imaging processes the treatment step is used to complete the formation of the latent image before or during development. Such systems include photopolymer systems, e.g., as disclosed by Pazos in U.S. Pat. No. 4,198,242 or Dueber et al. in U.S. Pat. No. 4,477,556, containing a photoinhibitor wherein imaging exposure generates inhibitor in the exposed areas of the layer and a subsequent uniform exposure to actinic radiation, or in some instances uniformly heated, generates a latent image in the complimentary areas free of photogenerated inhibitor. Such reversal systems also include photodesensitizable systems, e.g., as disclosed by Roos in U.S. Pat. No. 3,778,270, wherein, in the exposed areas, a component required for image or latent image formation is degraded or desensitized to an inactive form and the component in the unexposed areas is developed into an image or latent image by subsequent treatment with a reagent.

Illustrative of such photosensitive systems are those described in Chapter 7, "Polymer Imaging" by A. B. Cohen and P. Walker in Neblette's supra, pages 226-262, in which photocrosslinking, photodimerization, photocyclization, photosolubilization, and both ionic and free radical photopolymerization, as well as electrostatic photopolymer imaging and solid imaging are discussed. In Chapter 8, "Low Amplification Imaging Systems" by R. Dessauer and C. E. Looney, pages 263-278, imaging systems discussed include color forming free radical, diazo, and vesicular systems, photochromism, phototackification and photodetackification as well as thermal and photothermal systems.

Photopolymerizable Compositions

The imaging element can include as the composition sensitive to actinic radiation a photopolymerizable composition that contains an ethylenically unsaturated compound and a photoinitiator or photoinitiator system. The ethylenically unsaturated compound may also be referred to as monomeric material or monomer. In such systems generally a polymer is present which functions as a dispersible polymeric binder component to impart desired physical and chemical characteristics to the exposed and unexposed photopolymerizable composition. Upon exposure to actinic radiation, the photoinitiator system induces chain propagated polymerization of the monomeric material by either a condensation mechanism or by free radical addition polymerization. While all photopolymerizable mechanisms are contemplated, the compositions and processes of this invention will be described in the context of free radical initiated addition polymerization of monomers having one or more terminal ethylenically unsaturated groups. In this context, the photoinitiator system when exposed to actinic radiation acts as a source of free radicals needed to initiate polymerization of the monomer. The photoinitiator of the system may be activated by a photosensitizer which absorbs actinic radiation which may be outside the absorption spectrum of the initiator itself, to sensitize the addition polymerization in more practical radiation spectral regions such as near ultraviolet, visible light and near infrared. In the narrow sense, the term photoactive component of the compositions of this invention refers to the material which absorbs the actinic radiation, e.g., the photoinitiator or the photosensitizer, but in the broader sense the term photoactive component refers to any or all the essential materials needed for photopolymerization, i.e., the photoinitiating system and the monomer.

Photopolymerizable compositions contain an initiating system activated by actinic radiation and at least one ethylenically unsaturated compound capable of forming a high polymer by photoinitiated addition polymerization. Although photopolymerizable compositions having only the initiating system and the at least one ethylenically unsaturated compound will react to actinic radiation, typically in commercial use these compositions also include the polymeric binder component. Typically the at least one ethylenically unsaturated compound is nongaseous and has a boiling point above 100° C. at normal atmospheric pressure. In one embodiment the photopolymerizable compositions contain monofunctional or polyfunctional acrylates or methacrylates, and particularly preferred are such compositions containing monomers with two, three or more acrylate or methacrylate groups to allow concurrent crosslinking during the photopolymerization process. As such, the term "photopolymerizable" is intended to encompass systems that are photopolymerizable, photocrosslinkable, or both.

Addition Polymerizable Monomers

Monomers that can be used in the composition activated by actinic radiation are well known in the art, and include, but are not limited to, addition-polymerization ethylenically unsaturated compounds having relatively low molecular weights that is, molecular weights generally less than about 30,000, and preferably less than about 5000. Unless described otherwise in the specification, the molecular weight is the weighted average molecular weight. The addition polymerization compound may also be an oligomer, and can be a single or a mixture of oligomers. If a polyacrylol oligomer is used, the oligomer should preferably have a molecular weight greater than 1000. The composition can contain a single monomer or a combination of monomers. The monomer compound capable of addition polymerization is present in at least an amount of 5%, preferably 10 to 20%, by weight of the composition.

Suitable monomers include, but are not limited to, acrylate monoesters of alcohols and polyols; acrylate polyesters of alcohols and polyols; methacrylate monoesters of alcohols and polyols; and methacrylate polyesters of alcohols and polyols; where the alcohols and the polyols suitable include alkanols, alkylene glycols, trimethylol propane, ethoxylated trimethylol propane, pentaerythritol, and polyacrylol oligomers. Other suitable monomers include acrylate derivatives and methacrylate derivatives of isocyanates, esters, epoxides, and the like. A combination of monofunctional and multifunctional acrylates or methacrylates may be used.

Examples of suitable monomers include the following: t-butyl acrylate, hexanediol diacrylate, hexanediol dimethacrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropylone trimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, I-phenyl ethylene-1,2-dimethacrylate, pentaerythritol tetramethacrylate, trimethylol propane trimethacrylate, 1,5-pentanediol dimethacrylate, diallyl fumarate, 1,4-benzenediol dimethacrylate, 1,4-diisopropenyl benzene, and 1,3,5-triisopropenyl benzene.

Other examples of suitable monomers include acrylate and methacrylate derivatives of isocyanates, esters, epoxides and the like. In some end-use imaging systems it may be desirable to use monomer that provide elastomeric properties to the element. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than about 20% by weight).

A class of monomers are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,024, e.g., those having a plurality of addition polymerizable ethylenic linkages particularly when present as terminal linkages. Those class of monomers wherein at least one and preferably most of such linkages are conjugated with a double bonded carbon, including carbon double bonded to carbon and to such heteroatoms as nitrogen, oxygen and sulfur, are suitable in one embodiment. Also preferred are such materials wherein the ethylenically unsaturated groups, especially the vinylidene groups, are conjugated with ester or amide structures.

Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315.

Photoinitiator Systems

The photoinitiator can be any single compound or combination of compounds (that is, a photoinitiator system) which is sensitive to actinic radiation, generating free radicals which initiate the polymerization of the monomer or monomers without excessive termination. The photoinitiator system has one or more compounds that directly furnish free-radicals when activated by actinic radiation. The system also may contain a sensitizer that is activated by the actinic radiation, causing the compound to furnish the free-radicals. Useful photoinitiator systems typically will contain a sensitizer that extends spectral response into the near ultraviolet, visible, and near infrared spectral regions. Preferably, the photoinitiator is sensitive to actinic radiation in the ultraviolet and/or visible wavelengths of radiation. Photoinitiators are generally present in amounts from 0.001% to 10.0% based on the weight of the photopolymerizable composition.

Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocouumarins, and Michler's ketone may be used.

A large number of free-radical generating compounds, including redox systems such as Rose Bengal/2-dibutylaminethanol, may be selected to advantage. Photoreducible dyes and reducing agents such as those disclosed in U.S. Pat. Nos. 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos. 3,427,161; 3,479,185; 3,549,367; 4,311,783; 4,622,286; and 3,784,557 can be used as initiators. Other initiators are dye-borate complexes disclosed in U.S. Pat. No. 4,772,541; and trichloromethyl triazines disclosed in U.S. Pat. Nos. 4,772,534 and 4,774,163. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427-487. Similarly, the cyclohexadienone compounds of U.S. Pat. No. 4,341,860 are useful as initiators.

In one embodiment suitable photoinitiators include CDM-HABI, i.e., 1H-Imidazole, 2-(2-chlorophenyl)-1-[2-(-chlorophenyl-4,5-di(3-methoxyphenyl)-2H-imidazol-2-yl)]-4,5-di(3-methoxyphenyl)-; o-Cl-HABI, i.e., 1H-Imidazole, 2-(2-chlorophenyl)-1-[2-(2-chlorophenyl-4,5-diphenyl-2H-imidazol-2-yl)]-4,5-diphenyl-; and TCTM-HABI, i.e., 1H-Imidazole, 2-(2-chlorophenyl)-1-[2-(2-chlorophenyl)-4-(3,4-dimethoxyphenyl)-5-phenyl)-2H-imidazol-2-yl)]-4-(3,4-dimethoxyphenyl)-5-(phenyl)-; each of which is typically used with a hydrogen donor.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al. U.S. Pat. No. 3,652,275, and the arylyidene aryl ketones disclosed in Dueber U.S. Pat. No. 4,162,162. In one embodiment suitable sensitizers include the following: DBC, i.e., cyclopentanone; 2,5-bis-{[4-(diethylamino)-2-methylphenyl]-methylenel; DEAW, i.e., cyclopentanone, 2,5-bisf[4-(diethylamino)-phenyllmethylenel; dimethoxy-JDI, i.e., IH-inden-1-one, 2,3-dihydro-5,6-dimethoxy-2-[(2,3,6,7-tetrahydro-IH,5H-benzo[i, j]-quinolizin-9-yl)methylene)-; and JAW, i.e., cyclopentanone, 2,5-bis[(2,3,6,7-tetrahydro-IH,5H-benzo[i,j]quinolizin-1-yl)methylene]. Other particularly useful sensitizers are cyclopentanone, 2,5-bis[2-(1,3-dihydro-1,3,3-trimethyl-2H-indol-2-ylidene)ethylidene], CAS 27713-85-5; and cyclopentanone, 2,5-bis[2-(I-ethylnaphtho[1,2-d]thiazol-2(IH)-ylidene)ethylidenel, CAS 27714-25-6.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-Ir2,4-triazole-3-thiol; 6-ethoxy-2-mercaptobenzothiazole; 4-methyl-4H-1,2,4-triazole-3-thiol; 1-dodecanethiol; and mixtures thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

Polymeric Binder

Generally a photosensitive composition contains a polymer in addition to the one or more photoactive components. The polymer may be photoactive itself or may act as a matrix for the one or more photoactive components. The polymer is typically, but not necessarily, preformed. The polymer is not limited and includes polymers that are linear, branched, radial, comb, and can become interpenetrating networks. Other components in the composition should be compatible with the binder to the extent that a clear, non-cloudy photosensitive layer is produced.

The photopolymerizable composition may include a binder that is a preformed polymer that serves as a matrix for the monomer and photoinitiator system prior to exposure. The binder is a major contributor to the physical properties of the photopolymer, both before and after exposure. Addition of the binder allows the imaging element to be manufactured and handled as a dry film. As is the case with photoinitiators and monomers, the selection criteria for binders vary with the application. Molecular weight, glass transition temperature, flexibility, chemical resistance, solubility, toughness, and tensile strength, as well as cost and availability are among the factors that govern binder selection. The binder should be of sufficient molecular weight and have sufficiently high glass transition temperature that a film is formed when the composition is coated. Suitable binders can have widely varying molecular weights, from as low as 25,000 to greater than 300,000, to as much as 1,200,000 have been described. Unless otherwise indicated the molecular weight of the polymeric binder is a mean molecular weight Mw determined with the aid of gel permeation chromatography using polystyrene standards.

The binder can be a single polymer or mixture of polymers. The binder can be thermoplastic, elastomeric, or a thermoplastic elastomer. Binders include natural or synthetic polymers of conjugated diolefin hydrocarbons, including polyisoprene, 1,2-polybutadiene, 1,4-polybutadiene, and butadiene/acrylonitrile. In one embodiment, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. The block copolymers can be linear block copolymers, radial block copolymers, or quasi-radial block copolymers. The are usually three-block copolymers of the A-B-A type, but can also be two block copolymers of the A-B type or those comprising a plurality of alternating elastomeric and thermoplastic blocks, for example A-B-A-B-A. Suitable thermoplastic elastomeric binders of this type include poly (styrene/isoprene/styrene) block copolymers and poly(styrene/butadiene/styrene) block copolymers which are preferred. The non-elastomer to elastomer ratio is preferably in the range of from 10:90 to 35:65. In one embodiment, the binder is present in an amount of at least 55% by weight of the photosensitive layer for photosensitive elements useful as flexographic printing forms.

The term binder, as used herein, encompasses core shell microgels and blends of microgels and preformed macromolecular polymers, such as those disclosed in Fryd et al., U.S. Pat. No. 4,956,252 and Quinn et al., U.S. Pat. No. 5,707,773.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of some of these materials see U.S. Pat. No. 5,015,556.

Polymeric Modifiers

The photopolymerizable composition may contain a second polymeric binder to modify adhesion, flexibility, hardness, oxygen permeability, moisture sensitivity and other mechanical or chemical properties required during its processing or end use.

Suitable polymeric binders that can be used in combination include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., poly(vinyl chloride/vinyl acetate); polyvinyl pyrrolidone and copolymers, e.g., poly(vinyl pyrrolidone/vinyl acetate) saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acid; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

In the case where aqueous development of the photosensitive composition is desirable, the branched polymer product and/or the binder should contain sufficient acidic or other groups to render the composition processable in aqueous developer. Useful aqueous-processible binders include those disclosed in U.S. Pat. No. 3,458,311; U.S. Pat. No. 4,273,857; U.S. Pat. No. 6,210,854; U.S. Pat. No. 5,679,485; U.S. Pat. No. 6,025,098; U.S. Pat. No. 5,830,621; U.S. Pat. No. 5,863,704; and U.S. Pat. No. 5,889,116. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. In one embodiment, for aqueous development the photosensitive layer will be removed in portions which are not exposed to radiation but will be substantially unaffected during development by a liquid such as wholly aqueous solutions containing 1% sodium carbonate by weight.

Plasticizers

The photopolymerizable compositions may also contain a plasticizer to modify adhesion, flexibility, hardness, solubility, film-forming properties, and other mechanical or chemical properties required during its processing or end use. Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly (propylene glycol), glyceryl tributyrate, diethyl adipate, diethyl sebacate, dibutyl suberate, dioctyl phthalate, tricresyl phosphate, tributyl phosphate, tris(2-ethylhexyl) phosphate, Brij® 30 [$C_{12}H_{25}(OCH_2CH_2)_{40}OH$, and Brij® 35 [$C_{12}H_{25}(OCH_2CH_2)_{20}OH$].

Other examples of suitable plasticizers include modified or unmodified natural oils and resins; paraffinic mineral oils; alkyl, alkenyl, arylalkyl or arylalkenyl esters of acids, such as alkanoic acids or arylcarboxylic acids; aliphatic hydrocarbon oils, e.g., naphthenic and paraffinic oils; liquid polydienes, e.g., liquid polybutadiene, and liquid polyisoprene; and liquid oligomeric acrylonitrile-butadiene copolymers. Generally, plasticizers are liquids having molecular weights of less than about 5000, but can have molecular weights up to about 30,000. Plasticizers having low molecular weight will encompass molecular weights less than about 30,000. In one embodiment, the plasticizer is present from 5 to 40% by weight, based upon the composition.

Optional Components

Other compounds conventionally added to photopolymer compositions can also be present to modify the physical properties of the film for a particular use. Such components include: other polymeric binders, fillers, thermal stabilizers, hydrogen donors, thermal crosslinking agents, ultraviolet radiation materials, adhesion modifiers, coating aids, and release agents.

Crosslinking Agents

When the photopolymerizable composition is to be used as a permanent coating, such as a solder mask, a chemically or thermally activated crosslinking agent may be incorporated to improve high temperature characteristics, chemical resistance or other mechanical or chemical properties required in the end-use product. Suitable crosslinking agents include those disclosed by Gervay in U.S. Pat. No. 4,621,043 and Geissler et al. in U.S. Pat. No. 4,438,189, such as melamines, ureas, benzoguanamines and the like. Examples of suitable crosslinking compounds include: N-Methylol compounds of organic carboxamides; and C-methylol compounds of phenols, phenol-ethers and aromatic hydrocarbons. Instead of the aforementioned methylol compounds, it is also possible to use, for example, the corresponding methyl, ethyl or butyl ethers, or esters of acetic acid or propionic acid. A preferred crosslinking agent of this class is hexamethoxymethyl melamine.

Also useful as crosslinking agents are compounds containing two or more epoxy groups such as the bis-epoxides disclosed by Herwig et al. in U.S. Pat. No. 4,485,166. Bisglycidyl ethers of trihydric alcohols, such as glycerol, or of halogenated bisphenol A, can also be used. Preferred crosslinking agents of this class are 2,2-bis-(4-glycidoxyphenyl)-propane, 2,2-bis-(4-215 epoxyethoxy-phenyl)-propane, bis-glycidyl ether of tetra-chloro-bisphenol A, bis-glycidyl ether of tetra-bromo-bisphenol A, bis-oxiranyl ether of tetra-chloro-bisphenol A, and bis-oxiranyl ether of tetra-bromo-bisphenol A.

Also useful as crosslinking agents are blocked polyisocyanates. Upon heating the blocked polyisocyanate, the blocking groups split off to yield the free reactive polyisocyanate. Useful polyisocyanates include toluene diisocyanate; isophorone diisocyanate; 1,4-naphthalene diisocyanate; 1,6-hexamethylene diisocyanate; tetramethyl xylene diisocyanate; bis(4-isocyanatocyclohexyl)methane and the like. Useful blocking groups are derived from caprolactam; diethyl malonate; alcohols; phenols; oximes, e.g., methyl ethyl ketoxime; and the like.

Adhesion Promoter

When the photopolymerizable composition is to be used as a coating on a metal surface, such as a photoresist, a heterocyclic or mercaptan compound may be added to improve adhesion of the coating to the metal required during processing or in the end-use product. Suitable adhesion promoters include heterocyclics such as those disclosed by Hurley et al. in U.S. Pat. No. 3,622,334, Jones in U.S. Pat. No. 3,645,772, and Weed in U.S. Pat. No. 4,710,262. Preferred adhesion promoters for use in photoresists and solder masks include benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, 5-amino-1,3,4-thiodiazole-2-thiol, and mercaptobenzimidazole.

Other Components

The photopolymerizable compositions may contain other components such as thermal polymerization inhibitors, processing aids, antioxidants, antiozonants, dyes and pigments, optical brighteners and the like to stabilize, color or otherwise enhance the composition.

Thermal polymerization inhibitors that can be used in the photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Dyes and pigments are not limited however, any colorant used should preferably be transparent to the actinic radiation used.

Useful optical brighteners include those disclosed by Held in U.S. Pat. No. 3,854,950. Ultraviolet radiation absorbing materials useful in the invention are also disclosed by Held in U.S. Pat. No. 3,854,950. Optical brighteners are not encompassed within the photoluminescent tag of the present invention.

Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Photoresist Applications

The imaging elements of this invention are useful as photoresists for preparing printed circuit boards. In general the use of resists to prepare printed circuits is described in "Printed Circuits Handbook", Second Edition, edited by C. F. Coombs, Jr, published by McGraw-Hill, Inc. in 1979 which includes both screen printed resists as well as photoresists. The use of conventional photoresists for preparing photocircuits is described in "Photoresist—Materials And Processes", by W. S. DeForest, published by McGraw-Hill, Inc. in 1975 which includes negative working photopolymerizable and photocrosslinkable or dimerizable systems as well as positive working photosolubilizable systems. Photoresists may be used in temporary coatings in a primary imaging process to make the printed circuit or they may be used in a secondary imaging process to make permanent coatings, e.g., a solder mask, to protect the circuit during subsequent processing or from environmental effects during use. Permanent coatings also are used as intermediate insulative layers in the manufacture of multilayer printed circuits.

Prepress Proof Applications

The imaging elements of the present invention are useful as prepress proofs for preparing images from a multicolor original that will be representative of the printed image on-press. Proofing is a process which uses color separations to create a colored image called a proof to visualize what the final printed image will look like typically without actually making printing plates and running the printing press. Prepress proofs, which may also be referred to as off-press proofs or pre-plate proofs, are usually made by photochemical or photomechanical processes. These proofing systems generally make proofs by exposing photosensitive element to actinic radiation through one of the image bearing color separation transparencies to produce a duplicate image that is either a positive or a negative of the transparency depending on the element used. The radiation may make soluble areas insoluble, insoluble areas soluble, tacky areas nontacky, or nontacky areas tacky depending on the element used. After imagewise exposure, the photosensitive element can be developed by removing nonimagable areas, e.g., by washing out soluble areas. The tacky areas of the element may have to be toned with a dry or liquid colorant. Alternatively, the colorant may be incorporated into the imaging element. This process is repeated for all color separations. Then the processed elements are laminated together one at a time sometimes on a support or substrate. Protective layers may be peeled apart and removed from the element before they are laminated to the support or other image elements. Finally, the color images may be transferred from the support to a receptor, transfer or display sheet, such as a sheet of paper, to form the final proof.

Known methods of color proofing (prepress proofing) which use a photopolymer include an overlay method and a surprint method. In the overlay method, plural sheets having separation images of different color formed on transparent supports are prepared and then placed upon one another to conduct color proofing. In the surprint method, a multicolor image is obtained by successively forming separation images of different color on a single support.

In the overlay method, each color separation can be printed on a transparent supporter coated with colored sensitizer for every color and each color is superposed on a white sheet to perform the proofreading (U.S. Pat. No. 3,136,637; U.S. Pat. No. 3,221,553; U.S. Pat. No. 3,326,682; U.S. Pat. No. 4,282,308; U.S. Pat. No. 4,286,043; and EP 385 466, and exemplified by the DuPont "Cromacheck" system). This method allows rapid proof-making and can be utilized for preparing a color-separated proof by properly combining two or three colors.

The surprint method is disclosed, e.g., in U.S. Pat. Nos. 3,060,023, 3,060,024; 3,060,025; 3,060,026; 4,489,153; and EP 385 466 in which a plurality of images formed on the photosensitive layers according to images of separated colors are transferred to a single image receptor one after another to form a prepress proof. Each of the photosensitive layers may be colored with a color equivalent to the separated color of an image, or a transferred image may be colored with corresponding powder color toners.

Classes of photomechanical transfer that use heat derived from irradiation rather than photopolymerization are termed thermal transfer imaging and include dye diffusion or sublimation, thermal mass transfer and melt transfer.

In dye diffusion or sublimation, dyes are caused to migrate from a donor to a receptor in amounts proportional to the energy applied, giving continuous tone images, as in U.S. Pat. No. 5,034,371. In thermal mass transfer, zero or 100% transfer of the transfer layer takes place according to whether the applied energy exceeds a given level. Thermal mass transfer is highly suited to half tone reproduction since the resulting images consist of areas of zero or maximum optical density.

WO 88/04237 discloses a melt transfer thermal imaging medium which is laser-addressable, comprising a support sheet having a surface of a material which may be temporarily liquefied by heat and upon which is deposited a particulate or porous layer of an image forming substance which is wettable by the material in its liquefied state. Either the image forming substance is itself IR-absorbing, or a separate absorber is present. In exposed areas, the liquefiable material melts, wets the particles of the image forming substance, then resolidifies, thus anchoring the particles to the substrate. Removal of a stripping sheet (either present from the outset or applied subsequent to exposure) then causes selective removal of the particles in the non-exposed areas.

Also suitable are laser induced thermal mass transfer imaging processes and products which utilize a receiver element that are described in U.S. Pat. No. 6,294,308 of Caspar, et al., U.S. Pat. No. 5,834,154, of Yamazaki et al., U.S. Pat. No. 6,316,385 of Usuki, et al. and U.S. Pat. No. 6,294,308.

At least two modes of address may be distinguished for thermal transfer imaging, namely print head and infrared (IR) address. In the former, heat is typically supplied to the donor-receptor assembly via an external print head comprising an array of microresistors, while in the latter the energy is typically supplied by a radiant source (usually an IR emitter such as a laser) and converted to heat within the donor-receptor assembly by a suitably-placed radiation absorber. These processes have been described in, for example, Baldock, U.K. Patent 2,083,726; DeBoer, U.S. Pat. No. 4,942,141; Kellogg, U.S. Pat. No. 5,019,549; Evans, U.S. Pat. No. 4,948,776;

Foley et al., U.S. Pat. No. 5,156,938; Ellis et al., U.S. Pat. No. 5,171,650; and Koshizuka et al., U.S. Pat. No. 4,643,917.

These proofing methods are also well-known imaging processes that can be used in applications such as electronic circuit manufacture, color filters, display manufacture, lithography, and other areas.

Printing Form Applications

The imaging elements of this invention are useful as printing forms for relief printing, such as flexographic and letterpress printing, and lithographic printing. In general printing forms for use in printing and printing processes are described in Chapters 7 and 16 of "Imaging Processes And Material—Neblette's Eight Edition" edited by J. Sturge, V. Walworth and A. Shepp, Van Nostrand Reinhold, 1989, and in "Pocket Pal A Graphic Arts Production Handbook" edited by M. H. Bruno, International Paper Company, $15^{th}$ edition, 1994.

A preferred use for the imaging elements of the present invention is for relief printing forms, particularly flexographic printing forms. Flexographic printing processes and printing forms are described in "Flexography Principles And Practices" Foundation of Flexographic Technical Association, Inc., $4^{th}$ edition, 1991. Flexographic printing plates are widely used for printing of packaging materials ranging from corrugated carton boxes to card boxes and to continuous web of plastic films. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a layer of the photopolymerizable composition interposed between a support and a coversheet or a multilayer cover element. The thickness of the photopolymerizable layer can vary over a wide range depending upon the type of printing plate desired, for example, from about 0.010 inches to about 0.250 inches or greater (about 0.025 cm to about 0.64 cm or greater). For so-called "thin plates" typically the photopolymerization layer can range from about 0.010 inches to about 0.067 inches (about 0.025 cm to about 0.17 cm) in thickness.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. In one embodiment, the photoluminescent tag is added at an early stage of the extrusion process to assure that the tag is uniformly dispersed in the photosensitive composition. The extruded mixture is then calendered between the support and the temporary coversheet. Alternatively, the photopolymerizable material can be placed between the support and the temporary coversheet in a mold. The layers of material are then pressed flat by the application of heat and/or pressure.

Although a photosensitive printing element is typically used in sheet form, there are particular applications and advantages to using the printing element in a continuous cylindrical form. A continuous printing element has applications in the flexographic printing of continuous designs used in wallpaper, decoration and gift wrapping paper, and tight-fit conditions for registration, since the designs can be easily printed without print-through of the plate seam. Furthermore, such a continuous printing element is well-suited for mounting on laser exposure equipment where it can replace the drum or be mounted on the drum for exposure by a laser to achieve precise registration.

The formation of a seamless, continuous printing element can be accomplished by several methods. The photopolymerizable flat sheet element can be reprocessed by wrapping the element around a cylindrical form, usually a printing sleeve or the printing cylinder itself, and fusing or joining the edges together to form a seamless, continuous element. Processes for joining the edges of a plate into a cylindrical form have been disclosed, for example, in German patent DE 28 44 426, United Kingdom patent GB 1 579 817, European patent application EP 0 469 375, U.S. Pat. No. 4,883,742, and U.S. Pat. No. 4,871,650. Cylindrical seamless photopolymerizable elements may also be prepared according to the method and apparatus disclosed by Cushner et al. in U.S. Pat. No. 5,798,019.

Flexographic printing plates are characterized by their ability to crosslink or cure upon exposure to actinic radiation. Typically the plate is uniformly exposed through the backside of the plate to a specified amount of actinic radiation. Next, an imagewise exposure of the front-side of the plate is made through an image-bearing artwork or a template, such as a photographic negative or transparency (e.g. silver halide film) or through an in-situ mask having radiation opaque areas that had been previously formed above the photopolymerizable layer. The plate is exposed to actinic radiation, such as an ultraviolet (UV) or visible light. The actinic radiation enters the photosensitive material through the clear areas of the transparency and is blocked from entering the black or opaque areas. The exposed material crosslinks and becomes insoluble to solvents used during image development. The unexposed, uncrosslinked photopolymer areas under the opaque regions of the transparency remain soluble and are washed away with a suitable solution, i.e., solvent or aqueous-based, leaving a relief image suitable for printing. Then the plate is dried. Alternatively, a "dry" thermal development process may be used to form the relief image in which the imagewise exposed photosensitive layer is contacted with an absorbent material at a temperature sufficient to cause the composition in the unexposed portions of the photosensitive layer to soften or melt and flow into the absorbent material. See U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is, do not soften or melt, at the softening temperature for the unexposed portions. The absorbent material collects the softened un-irradiated material and then is separated and/or removed from the photosensitive layer. The cycle of heating and contacting the photosensitive layer may be repeated several times in order to sufficiently remove the flowable composition from the un-irradiated areas and form a relief structure suitable for printing. The printing plate can be further treated to remove surface tackiness. After all desired processing steps, the plate is mounted on a cylinder and used for printing.

Flexographic printing forms made from photopolymerizable compositions which are soluble, swellable, or dispersible in aqueous, semi-aqueous, or organic solvent developers (so called wet development) may also be capable of liquifying upon thermal development to form the relief surface. Examples of suitable compositions for solvent development have been disclosed, for example, in Chen et al., U.S. Pat. No. 4,323,637, Grüetzmacher et al., U.S. Pat. No. 4,427,749 and Feinberg et al., U.S. Pat. No. 4,894,315.

In this embodiment where the imaging element forms a recording element for use as a flexographic printing form, the imaging element may include one or more additional layers with the photosensitive layer. The photosensitive element may include one or more additional layers on the side of the photosensitive layer opposite a substrate support. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, during treatment to form the recording element. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

Additional Layers

The support can be any flexible material that is conventionally used with the imaging element used to prepare the recording element. Examples of suitable support materials include polymeric films such those formed by addition polymers and linear condensation polymers, transparent foams, fabrics, and metals. The support can be single layer or multilayer, and can be in any form. A preferred support is a polyester film; particularly preferred is polyethylene terephthalate.

For imaging elements used for flexographic printing, the support can be any flexible material that is conventionally used with photosensitive elements used to prepare flexographic printing forms. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Sleeves suitable for use as the support is not limited, provided that the sleeve meets desired functionality in end-use. The sleeve is not limited by the structure or the materials of construction, and can include single and multiple layered sleeves. An example of a multiple layered sleeve is disclosed in U.S. Pat. No. 5,301,610. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve typically has a wall thickness from 10 to 80 mils (0.025 to 0.203 cm) or more. Preferred wall thickness for the cylinder form is 10 to 40 mils (0.025 to 0.10 cm).

Optionally, the imaging element includes an adhesive layer between the support and the photosensitive layer, or a surface of the support that is adjacent the photosensitive layer has an adhesion-promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed by Burg in U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

The imaging element may further include a temporary coversheet on top of the uppermost layer of the element, which uppermost layer may be the photopolymerizable layer, or any of the additional layers. One purpose of the coversheet is to protect the uppermost layer of the imaging element during storage and handling. The temporary coversheet may be removed by peeling it away from the element prior to or after imagewise exposure. For digital-to-plate image processing, the coversheet is removed prior to exposing the infrared-sensitive layer to infrared laser radiation. Examples of suitable materials for the coversheet include a thin film of polystyrene, polyethylene, polypropylene, polycarbonate, fluoropolymer, polyamide, or polyester, which film can be subbed with release layers. The coversheet is preferably prepared from polyester, such as Mylar® polyethylene terephthalate film; most preferably the coversheet is 2-mil thick Mylar® film.

For imaging elements useful as flexographic recording (or printing) elements, the surface of the photopolymerizable layer may be tacky and a release layer having a substantially non-tacky surface can be applied to the surface of the photopolymerizable layer. Such release layer can protect the surface of the photopolymerizable layer from being damaged during removal of an optional temporary coversheet and can ensure that the photopolymerizable layer does not stick to the coversheet. During image exposure, the release layer can prevent the image-bearing mask from binding with the photopolymerizable layer. The release layer is insensitive to actinic radiation. The release layer is also suitable as a first embodiment of the barrier layer which is optionally interposed between the photopolymerizable layer and the actinic radiation opaque layer. The elastomeric capping layer may also function as a second embodiment of the barrier layer. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof.

The imaging element includes at least one photosensitive layer that can be of a bi- or multi-layer construction. Further, the imaging element may include an elastomeric capping layer on the at least one photopolymerizable layer. The elastomeric capping layer should have an elastic modulus in the polymerized state not substantially less than the elastic modulus of the photopolymerizable layer in the exposed state. The composition of the elastomeric layer comprises an elastomeric polymeric binder, an optional second polymeric binder and optionally a nonmigratory dye or pigment. The elastomeric composition can also contain a monomer or monomers and a photoinitiating system. The elastomeric polymeric binder in the elastomeric composition is generally the same as or similar to the elastomeric binder present in the photopolymerizable layer. The elastomeric capping layer is typically part of a multilayer cover element that becomes part of the photosensitive printing element during preparation of the photopolymerizable layer. Such multilayer cover elements and compositions suitable as the elastomeric capping layer are disclosed in Gruetzmacher et al., U.S. Pat. No. 4,427,759 and U.S. Pat. No. 4,460,675. Although the elastomeric capping layer may not necessarily contain photoreactive components, the layer ultimately becomes photosensitive when in contact with the photopolymerizable layer. As such, upon imagewise exposure to actinic radiation, the elastomeric capping layer has portions in which polymerization or crosslinking have occurred and portions which remain unpolymerized, i.e., uncrosslinked. The elastomeric capping layer is similar to the photosensitive layer in that after imagewise exposure the elastomeric capping layer is at least partially removable during treatment to form the relief.

In one embodiment of imaging elements useful as flexographic recording elements, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Infrared-sensitive layers and actinic radiation opaque layers are well known in the art. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; and EP 0 741 330 A1. The infrared-sensitive layer preferably is removable by contact with an absorbent material in the range of acceptable developing temperatures for the photosensitive element used.

The one or more additional layers preferably are removable, in whole or in part, during treatment to form the relief image. That is the by contact with the development medium in the range of acceptable developing temperatures for the photosensitive element used.

Process of Use

An advantage of the present invention is that the optimum process conditions can be set for each element with minimal intervention by the user. The conditions used in the process-of-use steps to convert the imaging element to the recording element can be set to maximize performance of the imaging element, based on information provided by the photoluminescent tag. The method for making the recording element includes providing the imaging element of the present invention, exposing the imaging element to the actinic radiation, and treating the exposed element to form the recording element. The treating step is not limited, and includes conventional steps to transform the exposed imaging element into the desired recording element. Treating can include treatment with one or more solutions, such as washout, and etching; peeling; laminating; applying heat, etc. as appropriate for the particular type of imaging element that converts the imaged photosensitive layer to a readable recording element. The solutions for treating the imaging element can be water, basic solutions, acid solutions, aqueous-based solutions, semi-aqueous based, and solvent.

In the embodiment in which the imaging element forms a recording element for use as a flexographic printing form, the method for making a flexographic printing form comprising the steps of (a) imagewise exposing the imaging element of the present invention to actinic radiation to selectively polymerize portions of the photopolymerizable layer; and (b) treating the element resulting from step (a) to remove unpolymerized portions of the photopolymerizable layer to form a relief image. The method would typically include a step of exposing the element to radiation at the second wavelength that the photoluminescent tag is responsive.

In order to make the flexographic printing form, the imaging element of the present invention is exposed to actinic radiation from suitable sources. A mercury vapor arc or a sunlamp can be used at a distance of about 1.5 to about 60 inches (about 3.8 to about 153 cm) from the photosensitive printing element. Exposure temperatures are preferably ambient or slightly higher, i.e., about 20° C. to about 35° C. Exposure time can vary from a few seconds to tens of minutes, depending on the intensities and wavelengths of the actinic radiation, the nature and volume of the photopolymerizable layer, the desired image resolution, and the distance from the photosensitive printing element. The exposure process usually comprises a back exposure and a front imagewise exposure, although the former is not strictly necessary. The back exposure or "backflash" can take place before, after or during image-wise exposure. Backflash prior to imagewise exposure is generally preferred. Back flash time can range from a few seconds to about 10 minutes, and creates a shallow layer of polymerized material, or a floor, on the support side of the photopolymerizable layer and sensitizes the photopolymerizable layers and the support, helps highlight dot resolution and also establishes the depth of the plate relief. The floor improves adhesion of the photopolymerizable layer to the support, and provides better mechanical integrity to the photosensitive element.

Imagewise exposure can be carried out by exposing the photosensitive printing element through an image-bearing mask, which may be referred to as an analog exposure or process. The image-bearing mask, a black and white transparency or negative containing the subject matter to be printed, can be made from silver halides films or other means known in the art. The image-bearing mask is placed on top of the photosensitive printing element after first stripping off the temporary coversheet. Imagewise exposure can be carried out in a vacuum frame, which provides proper contact of the image-bearing mask and the top surface of the photosensitive printing element, and removes atmospheric oxygen which is known to interfere with the free-radical polymerization process. The photosensitive printing element is then exposed to actinic radiation. On exposure, the transparent areas of the negative allow addition polymerization or crosslinking to take place, while the opaque areas remain uncrosslinked. Exposure is of sufficient duration to crosslink the exposed areas down to the support or to the back exposed layer. Imagewise exposure time is typically much longer than backflash time, and ranges from a few to tens of minutes.

Direct-to-plate image formation as disclosed in U.S. Pat. No. 5,262,275; U.S. Pat. No. 5,719,009; U.S. Pat. No. 5,607,814; van Zoeren, U.S. Pat. No. 5,506,086; and EP 0 741 330 A1, may also be referred to as digital exposure or process. For the digital process, the presence of the infrared-sensitive (and/or radiation opaque) layer is required. An image-bearing mask is formed directly onto the infrared-sensitive layer in situ using an infrared laser exposure engine. Imagewise exposure of printing forms through such a photoablative mask can be done without using a vacuum frame, simplifying the printing plate making process. The exposure process involves (1) imagewise ablating the infrared-sensitive layer of the photosensitive printing element described above to form a mask; and (2) overall exposing the photosensitive element to actinic radiation through the mask. The exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the imaging element. The preferred photosensitivity of most common flexographic printing forms are in the UV and deep visible area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. These radiation sources generally emit long-wave UV radiation between 310-400 nm. Flexographic printing plates sensitive to these particular UV sources use initiators that absorb between 310-400 nm. It is contemplated that the imagewise exposure to infrared radiation for those embodiments which include the infrared-sensitive layer and the overall exposure to actinic radiation can be carried out in the same equipment. It is preferred that this is done using a drum, i.e., the photosensitive printing element is mounted on a drum which is rotated to allow for exposure of different areas of the photosensitive printing element.

Following overall exposure to UV radiation through the image-bearing mask, the photosensitive printing element is treated to remove unpolymerized areas in the photopolymerizable layer and thereby form a relief image. Treatment of the photosensitive printing element can include (1) "wet" development wherein the photopolymerizable layer is contacted with a suitable developer solution to washout unpolymerized areas and (2) "dry" development wherein the photopolymerizable layer is heated to a development temperature which causes the unpolymerized areas to melt or soften and is contacted with an absorbant material to wick away the unpolymerized material. Dry development may also be called thermal development. Wet development is usually carried out at about room temperature. The developer solution can include an organic solvent, an aqueous or a semi-aqueous solution, or water. The choice of the developer solution will depend primarily on the chemical nature of the photopolymerizable composition to be removed. A suitable organic solvent developer includes an aromatic or an aliphatic hydrocarbon, an aliphatic or an aromatic halohydrocarbon solvent, or a mixture of such solvents with a suitable alcohol. Other organic solvent developers have been disclosed in published German Application 38 28 551. A suitable semi-aqueous developer can contain water and a water miscible organic solvent and an alkaline material. A suitable aqueous developer can contain water and an alkaline material. Other suitable aqueous developer solution combinations are described in U.S. Pat. No. 3,796,602.

Development time can vary, but it is preferably in the range of about 2 to about 25 minutes. The developer solution can be applied in any convenient manner, including immersion, spraying, and brush or roller application. Brushing aids can be used to remove the unpolymerized portions of the photosensitive printing element. Washout can be carried out in an automatic processing unit which uses developer and mechanical brushing action to remove the unexposed portions of the resulting flexographic printing plate, leaving a relief constituting the exposed image and the floor.

Following treatment by developing in solution, the flexographic printing plates are generally blotted or wiped dry, and then more fully dried in a forced air or infrared oven. Drying times and temperatures may vary, however, typically the plate can be dried for about 60 minutes to about 120 minutes at about 60° C. High temperatures are not recommended because the support can shrink, and this can cause registration problems.

In thermal development, the photopolymerizable layer can be heated to a development temperature typically between about 40° C. and 200° C. which causes the unpolymerized areas to liquefy, that is, to melt, soften, or flow. The photopolymerizable layer can then be contacted with a development material to remove the unpolymerized photopolymerizable composition. The polymerized areas of the photopolymerizable layer have a higher melting temperature than the unpolymerized areas and therefore do not melt at the development temperatures (see U.S. Pat. No. 5,215,859 and WO 98/13730). Apparatus suitable for thermal development of photosensitive printing elements is disclosed in U.S. Pat. No. 5,279,697 and U.S. Pat. No. 6,797,454.

In another alternate embodiment the imaging element may be suitably reinforced and then imagewise exposed to laser radiation to engrave or remove the reinforced layer in depth imagewise. U.S. Pat. No. 5,798,202; U.S. Pat. No. 5,804,353; and U.S. Pat. No. 6,757,216 B2 disclose suitable processes for making a flexographic printing plate by laser engraving a reinforced elastomeric layer on a flexible support. The processes disclosed in U.S. Pat. Nos. 5,798,202 and 5,804,353 involve reinforcing and laser engraving a single-layer, or one or more layers of a multi-layer, of a flexographic printing element comprised of a reinforced elastomeric layer on a flexible support. The elastomeric layer is reinforced mechanically, or thermochemically, or photochemically or combinations thereof. Mechanical reinforcement is provided by incorporating reinforcing agents, such as finely divided particulate material, into the elastomeric layer. Photochemical reinforcement is accomplished by incorporating photohardenable materials into the elastomeric layer and exposing the layer to actinic radiation. Photohardenable materials include photocrosslinkable and photopolymerizable systems having a photoinitiator or photoinitiator system.

The flexographic printing forms made using the imaging element of the present invention can be uniformly post-exposed to ensure that the photopolymerization process is complete and that the photosensitive printing element will remain stable during printing and storage. This post-exposure step can utilize the same radiation source as the main exposure.

Detackification is an optional post-development treatment which can be applied if the surface of the flexographic printing plate is still tacky, such tackiness not generally being removed in post-exposure. Tackiness can be eliminated by methods well known in the art, such as treatment with bromine or chlorine solutions, and by exposure to radiation sources having a wavelength not longer than 300 nm.

The imaging element of the present invention is particularly useful in forming the recording element for flexographic printing on surfaces which are soft and easily deformable, such as packaging materials, e.g., cardboard and plastic films. The photosensitive printing elements of the present invention can be used in the formation of seamless, continuous flexographic printing forms. The present imaging elements in the form of a flat sheet can be wrapped around a cylindrical form, usually a printing sleeve or the printing cylinder itself, and its edges fused together to form a seamless, continuous photosensitive printing element. In a preferred method, the photopolymerizable layer is wrapped around the cylindrical form and the edges joined. One process for joining the edges has been disclosed in German patent DE 28 44 426. The photopolymerizable layer can then be spray coated with at least one additional layer as described herein, if desired.

As was described above, in the embodiment where the imaging element forms a recording element suitable for use as a flexographic printing form several possible structures of the imaging element are possible. The selection of the photoluminescent tag used in the element can be influenced by one or more of the process steps that the imaging element will undergo to form the printing form.

When imaging the photosensitive element a variety of electromagnetic radiation wavelengths may be used. For example, in the case of photopolymer printing plates as an imaging element there can be multiple wavelengths used to produce a relief printing form based on the plate making process and the type of mask (if needed). Table 1 lists the first wavelengths of radiation, $\lambda_1$, that may be necessary to image the printing plate as well as optional wavelengths, $\lambda_D$, that are typically needed based on the platemaking process used.

TABLE 1

Typical Wavelengths for Imaging Flexographic Printing Element

| Platemaking process | Type of Mask | $\lambda_1$ | $\lambda_D$ |
|---|---|---|---|
| Analog | phototool or film negative | UV (250-400 nm) | Not applicable |
| Digital | Ablative mask | UV (250-400 nm) | near-IR (800-1100 nm) |
| Engraved | No Mask | may need UV (250-400 nm) | near-IR (800-1100 nm) or IR (about 10600 nm) | wherein:
$\lambda_1$ First wavelength used in the imaging of the photosensitive element
$\lambda_D$ Optional additional wavelength used in the imaging of the photosensitive element Consequently, based on the imaging process, the second wavelength that excites the tag needs to be chosen. The photoluminescent tag is responsive to the second wavelength of radiation, $\lambda_2$, that is, the tag is stimulated or excited at the second wavelength. For example, the choice of second wavelength is at least limited by the wavelength of radiation, $\lambda_1$, used for the primary photosensitive system, and may optionally be also limited by the one or more additional wavelengths $\lambda_D$, necessary to perform the process to convert the imaging element to a recording element, as described in Table 2. For instance, when making a relief printing form from a photopolymer printing precursor using a film negative in the analog platemaking process, the first wavelength, $\lambda_1$, is in the UV region. The photoluminescent tag would be selected so that, the tag would be responsive to the second wavelength, $\lambda_2$, in for example, the visible, near-IR or IR region. This would prevent imaging of the photosensitive material if the tag excitation is done prior to the imaging exposure steps, or in a region of the printing form that is not meant to be imaged after a latent image is formed.

TABLE 2

Possible Choices of Second Wavelengths for Detecting the Presence of a Photoluminescent Tag in a Flexographic Printing Element

| Platemaking process | $\lambda_2$ | Factors Impacting Choice of $\lambda_2$ |
|---|---|---|
| Analog | Visible, Near-IR or IR (>400 nm) | level of tag in composition; size of tag particulate; uniformity of disposition of tag in the imaging element; absorption characteristics of imaging element at $\lambda_2$ |
| Digital | Visible (400-800 nm) | level of tag in composition; size of tag particulate; uniformity of disposition of tag in the imaging element; absorption characteristics of imaging element at $\lambda_2$ |
| Digital | Near-IR or IR (>400 nm) | level of tag in composition; size of tag particulate; uniformity of disposition of tag in the imaging element; absorption characteristics of imaging element at $\lambda_2$; potential for tag to induce a response to $\lambda_D$ |
| Engraved | Visible (400-800 nm) | level of tag in composition; size of tag particulate; uniformity of disposition of tag in the imaging element; absorption characteristics of imaging element at $\lambda_2$ |
| Engraved | Near-IR or IR (>400 nm) | level of tag in composition; size of tag particulate; uniformity of disposition of tag in the imaging element; absorption characteristics of imaging element at $\lambda_2$; potential for tag to induce a response to $\lambda_D$ |

Legend:
$\lambda_2$ Second wavelength used to excite (or stimulate) the tag (assumes that first wavelength used to photopolymerize the printing element is between 200 and 400 nm)

Furthermore as shown Table 2, the photoluminescent tag must be carefully selected for excitation by the second wavelength when the imaging element will be exposed to wavelengths other than $\lambda_1$ in the process of use such as in the digital platemaking process or engraving process. In one embodiment, the photoluminescent tag is chosen to be responsive to a second wavelength (that is outside of the wavelength or wavelengths used in the imaging process) needed for the stimulation process. If the tag is responsive in the region of the spectrum that does not overlap with the first wavelength or the optional imaging wavelength (such as the laser wavelength for digital imaging) there is no potential for undesirable imaging of the element when the excitation process is being performed. Alternatively, the photoluminescent tag could be chosen to be responsive or somewhat responsive to the second wavelength that is close to the optional wavelengths, $\lambda_D$, used to digitally image or engrave the plate (but still different from the first wavelength used for the photopolymerization system). However, if there is overlap then there is potential for undesirable imaging of the element when excitation is in progress.

In one embodiment, the photoluminescent tag may be chosen to have a response to a second wavelength that is in a region of the spectrum that is used to expose the photosensitive element (such as the laser wavelength for digital imaging) provided that the concentration of the tag is such that the impact on the process operating at the optional wavelength $\lambda_D$ is made inconsequential. For example, by having the concentration level in a range from 1-1000 ppm of the photoluminescent tag responsive to IR radiation, the impact of the tag on the digital imaging process is made inconsequential. In other words, in the case of a photopolymer printing element that has the tag at a level between 1-1000 ppm in the element, it is possible that the digital layer could be ablated using near-IR wavelength (780-1100) laser imagers (optional imaging wavelength) without any impact to the surface or bulk properties of the photopolymer layer that contained the tag. As a result, the photopolymer printing element can be successfully imaged using the first wavelength (e.g., UV) and the ablated mask. In addition, the use of a light source that operates at the second wavelength to excite the tag will not induce any undesirable property change in the photopolymer layer.

The detection process is completed when the tag emits at a third wavelength, $\lambda_3$, that is read by the detection system.

Detection Process

Any device that is used in the process of forming a recording image from the imaging element can include a detection system that scans the element to sense the presence of the photoluminescent tag. The detection system, which can include a scanner and/or sensor, is not limited provided that the system can irradiate the imaging element with radiation suitable to excite the photoluminescent tag, and preferably also can detect the radiation emitted by the tag. Alternatively, the functions of scanning and sensing may be separated into different components within a process device. One component may be used to irradiate the imaging element and another component may be used to sense the emitted radiation. One type of suitable detection system are fluorospectrophotometers. It is important that the capability of the detection system, that is the exposing radiation wavelength (range) and the detecting radiation wavelength (range), correspond to the capability of the photoluminescent tag, that is, the exciting wavelength and emitting wavelength, respectively. Optionally, the detection system can be independent of the device used to produce the recording element, but electronically transmit information about the imaging element to the device. The device would include a programmable logic controller connected to a control console and the scanner/sensor. The controller may include a modem for connection to an external data communications network. The modem makes it possible to remotely collect operating data from, and provide commands to, the controller. The device may include a wireless communication device, such as for example, a radio-frequency communication device or other form, that could transmit data to the local area network which may be connected to other secondary processing devices that are needed to create the recording element. The scanner/sensor is set to scan the imaging element, receives the characteristic tag response, which identifies the imaging element and one or more characteristics of the element. In the case of imaging elements that are printing plates, the characteristic tag response can identify the chemical formulation (type) of the element, the total thickness of the element, a width of the element, and desired relief depth for the finished recording element.

The detection system not only can be used to identify the imaging element, but also can provide information that in combination with a controller or software containing data sets, is used to direct the establishment of the parameters in the variety of devices used in the imaging process automatically without the need for human intervention. The characteristic tag information can be used to determine or recommend the appropriate conditions needed at one or more steps in the process to transform the imaging element into the recording element. The characteristic tag response information can be used to recommend or establish appropriate conditions in one or more exposure units, laser exposure devices, development processors, and laminators, that are used with the imaging element. For instance, the characteristic tag response can be used to recommend or determine the appropriate conditions needed to expose the imaging element such as exposure time and energy level. The characteristic tag response of the imaging element for use as a flexographic printing form can also be used to recommend or determine appropriate conditions needed for thermal processing, such as the development temperature, pressure, drum rotation speed, and number of cycles of heating and contacting; or the conditions appropriate for solvent processing such as brush pressure, brush height, and residence time of element in solvent. The characteristic tag response can also be used to establish set-up parameters or recommend conditions appropriate for laser imagers or engraving devices such as laser settings and drum rotation speed. The characteristic tag response can also be used to establish set-up parameters or recommend conditions appropriate for laminators such as pressure, temperature, and transport speed. Each step of the transforming the imaging element into a recording element, involves multiple variables which need to be set properly to extract optimum performance of the imaging element and create the desired recording element. It is desirable to provide an imaging element and system that can, with little invention by the user, set the needed process conditions. In this way the imaging element can be transformed into recording element with improved control of the process and consistent quality in the resulting recording elements.

There are other useful applications of this information as well. The scanner/sensor system may also transmit by a direct connection, or via modem, or via wireless communication, to a computer or data storage module the type and quantity of imaging elements used in the various devices in the process. This accumulation of data can be very useful in tracking and monitoring the stage of the process that a given imaging element may be undergoing. Also, by assimilating the type and quantity of imaging elements processed a user could track inventory levels automatically. In combination with wired or wireless communication networks this automatic inventory tracking capability could be combined with automated ordering and inventory replenishment processes that are highly valuable in many operations. The information regarding the imaging element (type, thickness, etc) can be combined with other knowledge that is either readily available or can be obtained regarding the intended image to further optimize the workflow and/or the processing conditions used in the process of producing the recording element.

EXAMPLES

Example 1

A photosensitive printing element suitable for use as a flexographic printing plate was prepared as follows. A photosensitive composition was prepared, extruded in a twin screw extruder, and calendered to form a photosensitive layer. The photosensitive composition including a binder of a poly (styrene-isoprene-styrene) (SIS) thermoplastic elastomer block copolymer, monomers of hexamethylene diacrylate and hexamethylene dimethacrylate, oils, an initiator, and other additives were combined in the extruder. An acrylic polymer blend containing 2 weight % of a photoluminescent tag was added so that the composition contain 20 ppm of the tag. The tag was a metal oxysulfide IR excited phosphor, type J142S from Sunstone, Inc. (New Brunswick, N.J.). The acrylic polymer/tag blend was added at the same point in the extrusion process as the SIS binder to ensure uniform mixing of the tag in the extruder. The initiator was Irgacure 651 (2,2-dimethoxyacetophenone) at approximately 2 weight % the composition. The photosensitive element was produced by calendering the extruded photosensitive composition between a PET support and a coversheet having a digital ablation layer. The photosensitive element was 67 mils thick.

The coversheet was prepared as described in Example 1 of U.S. Pat. No. 6,238,837, except that, the coversheet was temporarily attached to a first coversheet, i.e., piggy-back mode, such that the digital ablation layer was adjacent to the photosensitive layer during calendering. Afterwards, the portion of the photosensitive element having the laser ablation layer was cut out of the element and the first coversheet was removed. The temporary coversheet was removed prior to imagewise exposure to form the in-situ mask from the digital ablation layer. The digital ablation layer was composed of 67% polyamide and 33% carbon black.

The resulting photosensitive element was exposed through the support for 30 seconds to ultraviolet light at 354 nm. Then a mask was formed on the element by imagewise ablating the digital layer with infrared laser radiation in a CYREL® Digital Imager. The formed mask contained process work as well as lines and solids to help determine the imaging performance of the resulting printing plate. The element was main exposed through the mask to UV light at 354 nm for 10 minutes. The exposed element was thermally processed in a CYREL®FAST 1000TD Thermal Developer under conditions typically used for 67-mil plates to form a printing plate with a relief image structure suitable for flexographic printing. Thermal development was conducted by contacting the plate to a CYREL®FAST DR37 developer roll material carried over a heated roll at a temperature of 325° F., for 11 cycles. The presence of the tag did not interfere with the formation of the relief image. The plate was post exposed and light finished by exposure to UV A (365 nm) and UV C (254 nm) wavelengths for 6 minutes and 8 minutes, respectively.

The presence of the tag in the plate at 20 ppm level allowed for its detection. In a darkened room, a beam of near IR radiation from a laser pen light was directed on the plate. At that location, a green spot was detected by human eye indicating that the tag was capable of stimulated emission, by emitting the green light when stimulated with radiation in 900-1000 nm wavelength range.

Example 2

Four photosensitive elements were prepared as described in Example 1 with the exceptions that, the photoluminescent tag was added into the photosensitive composition for two elements at 100 ppm and for the other two elements at 200 ppm, and the tag was a metal oxysulfide IR excited phosphor, type TIR-9011 from Sunstone, Inc. Elements having each of the two levels of tag were produced with both the digital ablation layer as described in Example 1 of U.S. Pat. No. 6,238,837, and with a conventional release layer, i.e., polyamide, on top of the photosensitive layer.

The two elements with the digital layer were exposed and processed as described in Example 1. The two elements with the release layer were exposed through a phototool under vacuum to ultraviolet radiation at 365 nm for 10 minutes. All the remaining steps, including the back exposure were the same for these two plates. For all plates, the relief image was formed and the presence of the tag did not interfere with formation of the relief image.

Before and after the formation of relief image for all plates, a beam of near IR radiation from a laser pen light was directed on the plate. At that location, a green spot was easily detected (visible) by human eye. The tag was stimulated with radiation in the 900-1000 nm wavelength from the pen light to emit the green light in the 500-550 nm wavelength.

Control

A photosensitive element was produced as described in Example 1 with the exception that the element did not contain any tag compound. The element was exposed and processed as described in Example 1. The resulting printing plate formed a relief image as expected. The relief images of the plates formed in Example 1 and Example 2 were comparable to the relief image formed in the Control plate.

What is claimed is:

1. A printing form precursor comprising a layer of photopolymerizable composition that has a thickness range of 0.025 to 0.64 cm and is sensitive to ultraviolet (UV) radiation at a first wavelength in the UV region, and optionally one or more additional layers, wherein a photoluminescent tag excluding optical brighteners is disposed in the precursor in any one or more of the layers and is responsive to radiation at a second wavelength and responds by emitting radiation at a third wavelength, wherein the second and third wavelengths are different from the first wavelength and are outside the UV region, and further wherein the photoluminescent tag comprises an inorganic compound and the photopolymerizable composition is not sensitive to the second and third wavelengths.

2. The printing form precursor of claim 1 wherein the photoluminescent tag is disposed in the photopolymerizable composition.

3. The printing form precursor of claim 1 wherein the photopolymerizable composition comprises a monomer and an initiator or initiator system sensitive to actinic radiation at the first wavelength.

4. The printing form precursor of claim 3 wherein the photopolymerizable composition further comprises a binder.

5. The printing form precursor of claim 4 wherein the binder is an elastomeric binder.

6. The printing form precursor of claim 1 wherein the photoluminescent tag responds to excitation or stimulation at the second wavelength.

7. The printing form precursor of claim 1 wherein the photoluminescent tag responds by fluorescing, or phosphorescing, or having stimulated emission in response to exposure to radiation at the second wavelength.

8. The printing form precursor of claim 1 wherein the photoluminescent tag responds by becoming excited or stimulated in response to exposure to radiation at the second wavelength, and generates emitted radiation at a third wavelength that is different from the first wavelength and the second wavelength.

9. The printing form precursor of claim 1 wherein the photoluminescent tag is a metal oxysulfide phosphor.

10. The printing form precursor of claim 1 wherein the photoluminescent tag is present in the composition in an amount of 1 to 1000 parts per million based on the total amount of the composition.

11. The printing form precursor of claim 10 wherein the photoluminescent tag is present in the composition in an amount of 1 to 300 parts per million based on the total amount of the composition.

12. The printing form precursor of claim 1 further comprising at least one additional layer adjacent a first layer of the composition, the additional layer selected from the group consisting of a support layer, a release layer, a second composition layer sensitive to actinic radiation at the first wavelength, an elastomeric layer capable of becoming sensitive to actinic radiation at the first wavelength, a wax layer, an adhesion modifying layer, a laser-radiation sensitive layer, a coversheet, and combinations thereof.

13. The printing form precursor of claim 12 wherein the photoluminescent tag is disposed in the at least one additional layer.

14. The printing form precursor of claim 12 wherein the at least one additional layer is a laser-radiation sensitive layer which is sensitive to infrared laser radiation.

15. The printing form precursor of claim 1 wherein the photoluminescent tag is dispersed in a polymer forming a layer adjacent a layer of the composition.

16. The printing form precursor of claim 1 wherein the photopolymerizable composition comprises at least one monomer, a photoinitiator or initiator system sensitive to the UV radiation at the first wavelength, and the photoluminescent tag.

17. The printing form precursor of claim 1 further comprising at least one additional photoluminescent tag responsive to radiation at a wavelength different from the first wavelength outside the UV region and different from the second wavelength.

18. The printing form precursor of claim 1 wherein the first wavelength is between 250 to 400 nm.

19. The printing form precursor of claim 1 wherein the second wavelength is greater than 400 nm.

20. The printing form precursor of claim 1 wherein the second wavelength is between 800 to 1200 nm.

21. The printing form precursor of claim 1 wherein the photoluminescent tag responds by emitting at a third wavelength between 450 and 600 nm.

22. The printing form precursor of claim 1 wherein the photoluminescent tag is an anti-stokes phosphor.

23. The printing form precursor of claim 1 wherein the photoluminescent tag is present in the composition in an amount of 25 to 250 parts per million based on the total amount of the composition.

24. The printing form precursor of claim 1 further comprising a release layer disposed above the composition layer, and the photoluminescent tag is present in the release layer.

25. The printing form precursor of claim 1 wherein the composition layer is adjacent a support and the photoluminescent tag is present in the support.

26. The printing form precursor of claim 10, wherein the photoluminescent tag is present in concentrations less than 100 ppm.

27. The printing form precursor of claim 10, wherein the photoluminescent tag is present in concentrations less than 50 ppm.

* * * * *